United States Patent
Turati

(10) Patent No.: US 9,622,363 B2
(45) Date of Patent: Apr. 11, 2017

(54) STRUCTURE FOR CABINET

(71) Applicant: PRIVIUS S.r.l., Scarenna-Asso (CO) (IT)

(72) Inventor: Mauro Turati, Caslino d'Erba (IT)

(73) Assignee: PRIVIUS S.R.L., Scarenna-Asso (CO) (IT)

( * ) Notice: Subject to any disclaimer, the term of this patent is extended or adjusted under 35 U.S.C. 154(b) by 0 days.

(21) Appl. No.: 14/760,663

(22) PCT Filed: Dec. 12, 2013

(86) PCT No.: PCT/IB2013/060838
§ 371 (c)(1),
(2) Date: Jul. 13, 2015

(87) PCT Pub. No.: WO2014/111768
PCT Pub. Date: Jul. 24, 2014

(65) Prior Publication Data
US 2015/0359117 A1 Dec. 10, 2015

(30) Foreign Application Priority Data
Jan. 16, 2013 (IT) .............................. MI2013A0052

(51) Int. Cl.
*H02B 1/01* (2006.01)
*H05K 7/18* (2006.01)
(Continued)

(52) U.S. Cl.
CPC ........... *H05K 5/0217* (2013.01); *H02B 1/014* (2013.01); *H05K 5/0004* (2013.01); *H05K 7/18* (2013.01)

(58) Field of Classification Search
CPC .... H05K 1/014; H05K 5/0004; H05K 5/0217; H05K 7/18; A47B 47/00; A47B 47/0008;
(Continued)

(56) References Cited

U.S. PATENT DOCUMENTS 3,218,097 A * 11/1965 Bowers .............. A47B 47/0008
285/231
3,542,407 A * 11/1970 Brown ............... A47B 47/0008
403/172
(Continued)

FOREIGN PATENT DOCUMENTS

| EP | 0948916 A1 | 10/1999 |
|---|---|---|
| EP | 0977330 A1 | 2/2000 |
| WO | 2007020612 A1 | 2/2007 |

OTHER PUBLICATIONS

PCT Notification of Transmittal of the International Search Report and Written Opinion of the International Searching Authority mailed Mar. 10, 2014 issued in related PCT Application No. PCT/IB2013/060838 (7 pages).
(Continued)

*Primary Examiner* — James O Hansen
(74) *Attorney, Agent, or Firm* — Lucas & Mercanti, LLP

(57) ABSTRACT

A structure for a cabinet containing electrical materials is disclosed having posts, crossbeams and connecting means. The connecting means are adapted to join one to another at least two crossbeams and one post, and including a base element and a hollow element which is provided with a substantially axial opening. The base element is constrained to the crossbeams and has an inserting portion adapted to be inserted inside the hollow element. Conversely, the hollow element is adapted to be constrained to the post. In particular, the hollow element, the post and the inserting portion are each provided with a bore, the bores being alignable one to another in operative conditions. A joining element provided with a truncated—cone shaped portion is adapted to pass in each of the bores when they are aligned, so that to constrain one to another the hollow element, the post and the inserting portion.

15 Claims, 8 Drawing Sheets

(51) Int. Cl.
*H05K 5/02* (2006.01)
*H05K 5/00* (2006.01)

(58) Field of Classification Search
CPC ............ A47B 47/0016; A47B 47/0033; A47B 47/005; F16B 12/20; F16B 12/32; F16B 2012/145; H02B 1/014
USPC .......... 312/265.1, 265.4, 257.1; 403/14, 403, 403/408.1, 409.1, 171; 211/26, 182, 183, 211/189
See application file for complete search history.

(56) References Cited

U.S. PATENT DOCUMENTS

| | | | | |
|---|---|---|---|---|
| 3,858,989 A | * | 1/1975 | Field | A47B 47/0008 403/171 |
| 4,368,998 A | * | 1/1983 | Pestoor | A47B 47/0008 403/171 |
| 5,713,651 A | | 2/1998 | Essig et al. | |
| 5,769,519 A | * | 6/1998 | Nicolai | H02B 1/54 211/26 |
| 6,688,712 B2 | * | 2/2004 | Adams | E04B 1/3483 211/191 |
| 6,811,231 B1 | * | 11/2004 | Fontana | H02B 1/01 312/265.1 |
| 7,086,707 B2 | * | 8/2006 | Wyatt | H05K 7/183 312/265.3 |
| 2008/0218042 A1 | * | 9/2008 | Hartel | H02B 1/301 312/265.4 |
| 2008/0272677 A1 | | 11/2008 | Francisquini | |
| 2011/0309046 A1 | * | 12/2011 | Lee | A47B 47/03 211/182 |
| 2012/0024811 A1 | * | 2/2012 | Fan | H05K 7/1488 211/183 |

OTHER PUBLICATIONS

Italian Search Report dated Aug. 6, 2013 issued in related Italian Patent Application No. MI2013A000052 (2 pages).

* cited by examiner

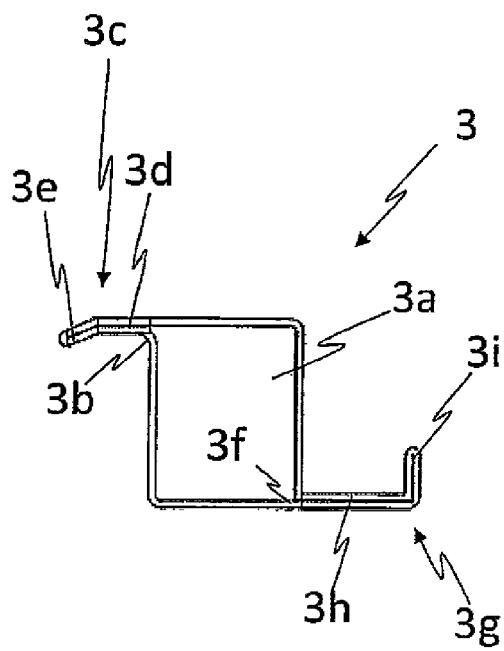
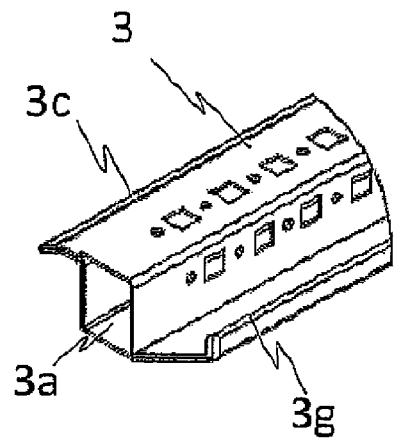
Fig. 6a          Fig. 6b
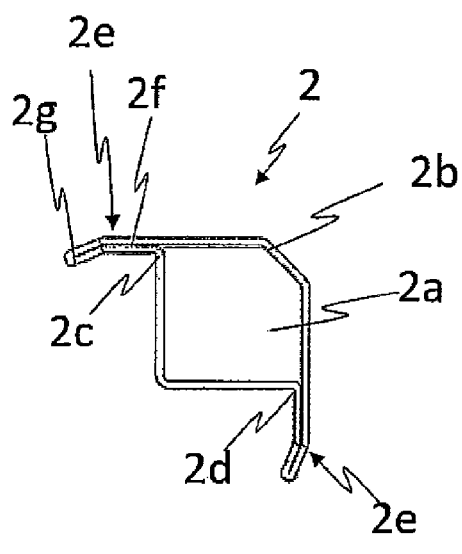
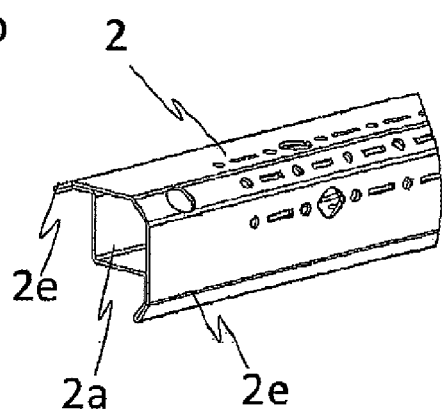
Fig. 7a          Fig. 7b

120
STRUCTURE FOR CABINET

CROSS-REFERENCE TO RELATED APPLICATIONS

This application is a 371 of PCT/IB2013/060838, filed Dec. 12, 2013, which claims the benefit of Italian Patent Application No. MI2013A000052, filed Jan. 16, 2013.

FIELD OF THE INVENTION

The present invention relates to the field of cabinets, with particular reference to the internal structure of a cabinet containing electrical materials, and to the means interconnecting the elements of the structure itself.

BACKGROUND OF THE INVENTION

In the art several structures are known for making up cabinets for electrical materials, and the related interconnecting means, which allow to assemble in few steps the structure itself.

The document EP0977330, for example, describes interconnecting means provided with flanges coupling with the structure profiles, shaped like the profiles themselves, and a threaded tight coupling body. A centering pin allows the positioning and restricts the rotation between the several elements. Such a solution actually allows to simply assemble the structure, but involves interconnecting means of a considerable complexity, then resulting in a complicated and costly manufacturing. Moreover, the centering pins are not able to prevent a relative movement of the elements to be coupled, even if it is a limited movement, caused by the clearance of the pin with respect to its seat.

SUMMARY OF THE INVENTION

An object of the present invention is to provide a structure for cabinets containing electrical materials having interconnecting means which may be simply manufactured.

Another object of the present invention is to provide a structure for cabinets containing electrical materials which ensures an effective coupling among the several elements, i.e. without relative displacements.

The present invention achieves these and other objects by way of a structure for a cabinet containing electrical materials according to claim 1, and interconnecting means for a cabinet according to claim 12.

The cabinet structure according to the present invention comprises first elongated elements acting as posts, second elongated elements acting as crossbeams and connecting means. The connecting means are adapted to join one to another at least two crossbeams and one post, although it could be possible to use the present invention for connecting several posts and/or crossbeams. The connecting means comprise a base element, and a hollow element that is provided with a substantial axial opening. The base element is adapted to be constrained to the crossbeams and comprises an inserting portion adapted to be inserted inside the hollow element. Conversely, the hollow element is adapted to be constrained to the post. In particular, the hollow element, the post and said inserting portion are each provided with a bore, said bores being alignable one to another in operative conditions. A joining element provided is adapted to pass in each of the bores when they are aligned, so that to constrain one to another the hollow element, the post and the inserting portion. More in detail, the joining element is provided with a truncated-cone shaped portion.

Thanks to the present invention, it is possible to effectively join the posts and the crossbeams together, by means of pieces shaped so as to be easy manufactured. In particular, the joining element ensures an effective tight coupling, preventing any minimal relative displacement of the various pieces, since the truncated-cone portion completely occludes the several bores, such as to remove any possible clearance.

According to one aspect of the present invention, the joining element is provided with a threaded portion, so that to further ensure the tight coupling among the pieces.

According to one aspect of the present invention, the inserting portion has at least two sections of different size.

According to a further aspect of the present invention, the base element comprises a preferably polyhedral main body, and a protrusion. In particular, said protrusion acts as an inserting portion.

According to a further object of the present invention, the inserting portion has a truncated-cone shape and, accordingly, also the opening of the hollow element has a truncated-cone shaped profile, substantially corresponding to the shape of the inserting portion.

According to a different object of the present invention, the inserting portion has a truncated-pyramid shape, preferably square based and, accordingly, also the opening of the hollow element has a truncated-pyramid shaped profile, substantially corresponding to the shape of the inserting portion.

According to another aspect of the present invention, the bore of the hollow element is at least partially threaded.

According to a further aspect of the present, at least one section of the posts has the shape of a hollow square, wherein one vertex of the square is beveled at 45°, and two further vertices of the square, opposite one to another, both have a flange, having a first portion shaped as the extension of one of the sides of the square, and a second portion tilted with respect to the first portion.

According to a further object of the present invention, at least one section of the crossbeams has the shape of a hollow rectangle, wherein a first vertex of the hollow rectangle has a flange having a first portion shaped as the extension of one of the sides of the rectangle, and a second portion tilted with respect to the first portion. A second vertex of the rectangle, i.e. opposite to the mentioned first vertex, has a flange having a first portion shaped as the extension of one of the sides of the rectangle, and a second portion perpendicular to the first portion.

According to a further object of the present invention, at least one of crossbeams and posts is made by a single bent foil.

According to a further object of the present invention, the main body is welded to two crossbeams.

BRIEF DESCRIPTION OF THE DRAWINGS

Exemplary and not limiting embodiments of the present invention are now illustrated with reference to figures, in which:

FIGS. 6a 7b are detailed views of the profiles used in the structure of FIG. 1;

Figure 1:
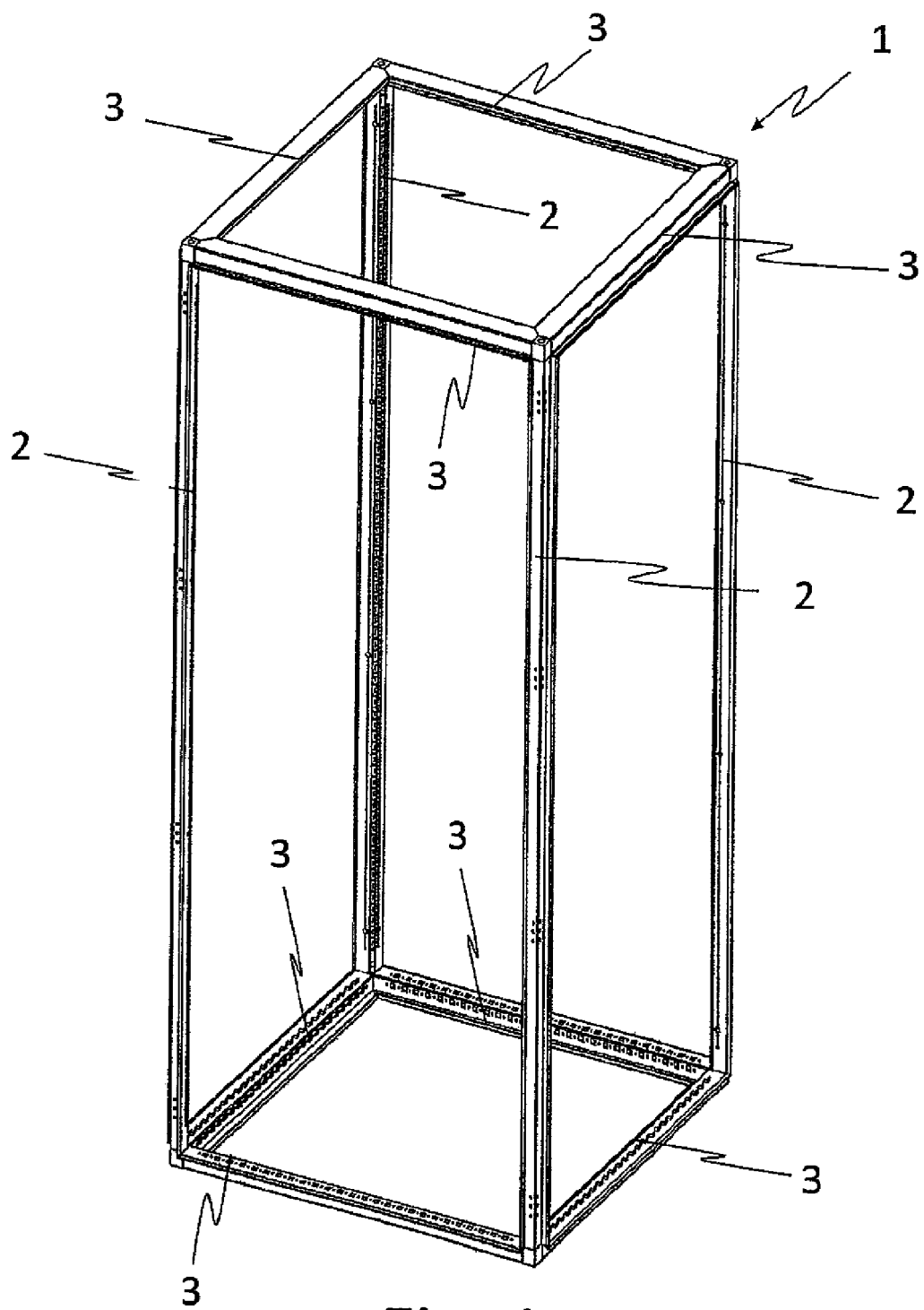
FIG. 1 is a perspective view of a structure according to the present invention.

According to the present invention, a structure 1 for cabinet containing electrical materials comprises first elongated elements acting as posts 2, hereinafter posts 2, and second elongated elements acting as crossbeams 3, hereinafter crossbeams 3, and connecting means 5 shown in detail in FIG. 3.

DETAILED DESCRIPTION OF THE INVENTION

The connecting means 5 are adapted to join one to another at least three elements, i.e. at least two crossbeams 3 and one post 2, although more posts and/or crossbeams could be contemplated.

The connecting means 5 comprise a base element 6 and a hollow element 7 provided with a substantial axial opening 8. The base element 6 is adapted to be constrained to the crossbeams 3 and comprises an inserting portion 6a adapted to be inserted into the hollow element 7. Conversely, the hollow element 7 is adapted to be constrained to the post 2, as better explained below.

The hollow element 7, the post 2 and the above mentioned inserting portion 6a are each provided with a bore 9, 10 and 11, said bores 9, 10 and 11 being alignable one to another in operative conditions, as better explained in the following treatise.

It should be noted, in particular, that different cavities are provided on the inserting portion 6a, which are referred to by different terms, that is to say the axial opening 8 and the bore 11.

The cavities of the hollow element 9 and the post 2, adapted to cooperate with the bore 11, are in turn specified as bores for easiness of comprehension, in particular the bore 9 of the hollow element 7 and the bore 10 of the post 2.

A joining element 12 is adapted to pass in each of the bores 9, 10 and 11 when they are aligned, so as to constrain one to another the hollow element 7, the post 2 and the inserting portion 6a. More in detail, the joining element 12 is provided with a truncated-cone shaped portion 12b and, preferably, a threaded portion 12a as well.

Although not shown in figures, at the free surface of the truncated-cone shaped portion 12b of the joining element 12 it is possible to provide a further shaped portion, having a shape that enables an easy use of the joining element 12 itself. For example, a portion provided with a hexagonal section could be added such as to allow to be operated by means of a hex key. Alternatively, on the free surface of the truncated-cone portion 12b, it is possible to provide a star-shaped notch able to operatively couple with a screwdriver. In general, means known in the art are provided, although not shown, to allow a user to easily operate on the joining element 12.

The base element 6 is composed of a main body 6b and a protrusion acting as an inserting portion 6a.

The base element 6 is typically made in one piece by metalworking.

The main body 6b has a polyhedral shape and, particularly, a cubic shape, but the main body 6b may assume other shapes.

A protrusion, acting as an inserting portion 6a, juts from the main body 6b and is provided with a bore 11 arranged so as to be substantially perpendicular with respect to the axis of the protrusion 6a.

As shown, the protrusion 6a has a section that varies along its length, constantly decreasing from its base so as to form a truncated-cone shaped profile. Such a configuration allows to easily insert the protrusion 6a into the hollow element 7 and assures an effective coupling between the base element 6 and the hollow element 7 once the first is definitely inserted in the second. In general, it is preferable to provide, a protrusion 6a having at least two sections of different sizes. For example, hereinafter a truncated-pyramid configuration will be introduced.

The hollow element 7 is preferably made of a metallic material, and it is provided with an opening 8 substantially axially arranged with respect to the piece, and a bore 9 perpendicularly arranged with respect to the piece.

Figure 4:
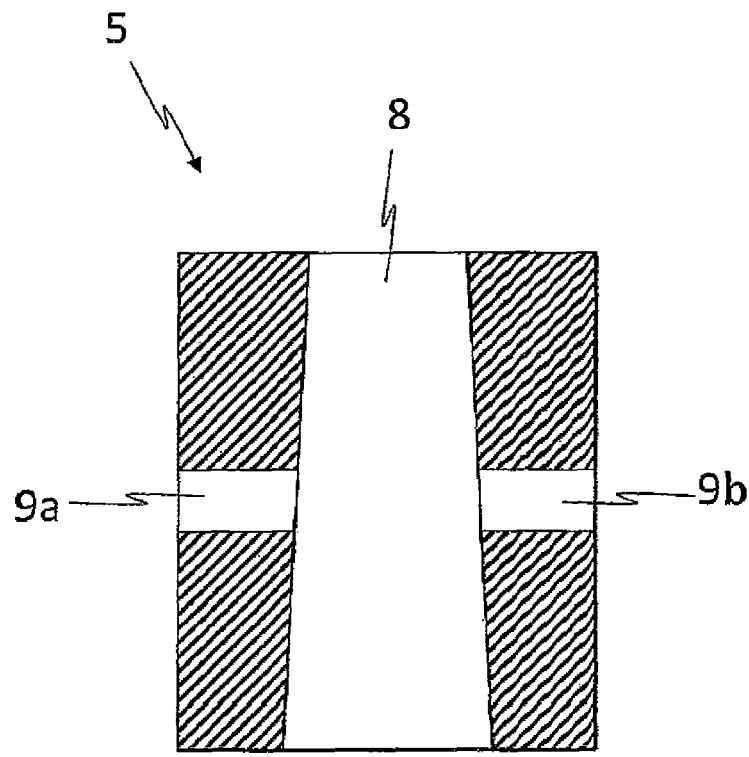
FIG. 4 is a sectional view of a hollow element of the present invention.

Referring also to FIG. 4, it should be noted that the piece has a cylindrical profile, whereas the inner shape of the opening 8 corresponds to the shape of the protrusion 6a, therefore having a truncated cone shaped profile as well.

As shown in FIG. 4, the bore 9 crosses the opening 8. As a result, the bore 9 divides into a first bore portion 9a and a second bore portion 9b, both specularly arranged on the side surface of the hollow element 7.

As better explained below, at least one, and preferably only one, bore portion 9b has a thread adapted to couple with the threaded portion 12a of the joining element 12.

Between the hollow element 7 and the base element 6 and, particularly, around the protrusion 6a of the base element 6, it is possible to arrange a seal 14 that is adapted to facilitate the tight coupling between the two pieces 6, 7 and to prevent a metal-to-metal contact between the base element 6 and the hollow element 7 at the base of the protrusion 6a.

Figure 5:
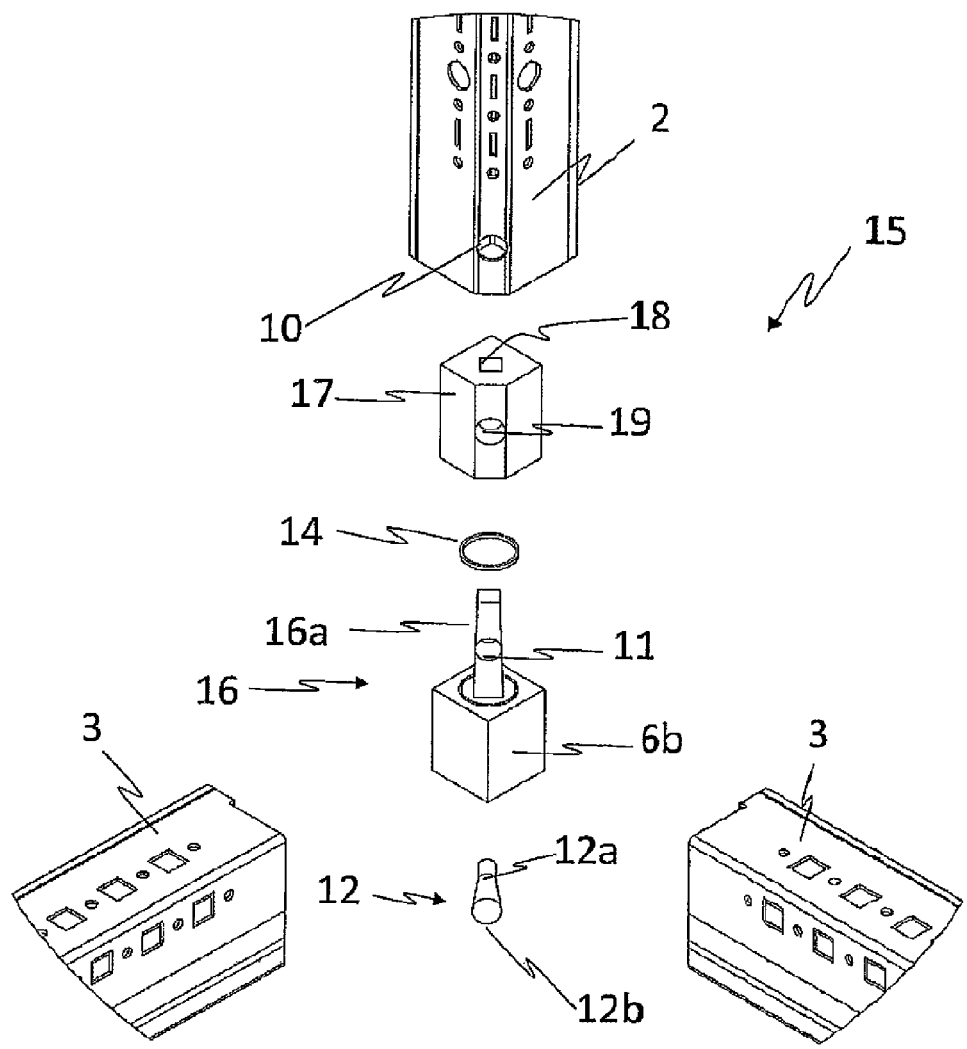
FIG. 5 is a view of an embodiment of the connecting means alternative to that of FIG. 3.

FIG. 5 shows a modification 15 of the connecting means 5.

The connecting means 15 comprise a base element 16 different from the base element 6 of the previous embodiment because of the shape of the protrusion 16a, having a square-based truncated pyramid shape, instead of the truncated cone shape of the protrusion 6a.

The hollow element 17 is shaped accordingly and, in particular, has an irregular outer prism shape, whereas the inner opening 18 that is arranged substantially axial to the piece, as the opening 8, has a truncated pyramid shaped profile. In more detail, the hollow element 17 has a squared section, one vertex of the square being beveled at 45°, whereas the opening 18 has a shape complementary to the protrusion 16a.

Figure 3:
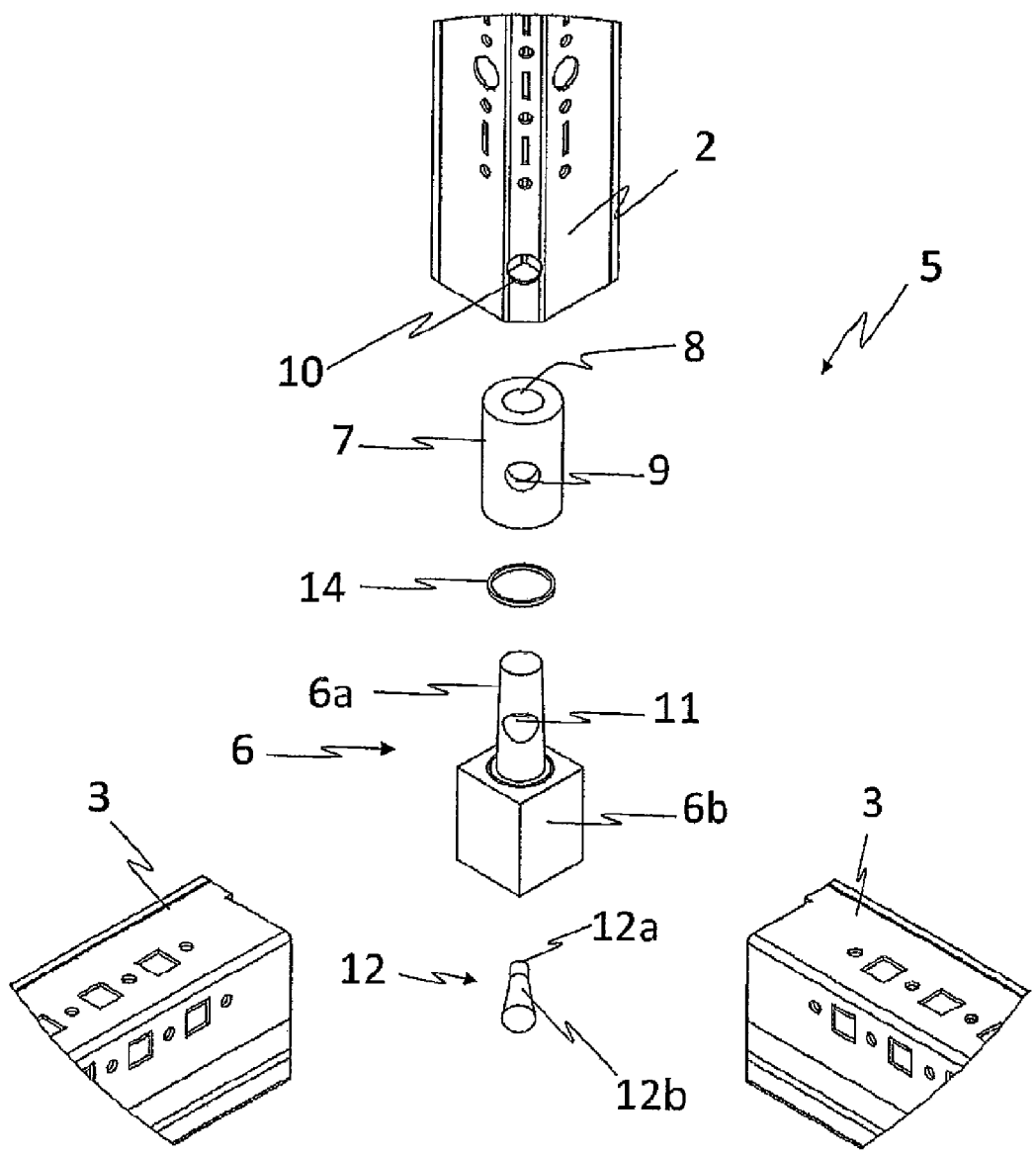
FIG. 3 is a perspective enlarged view of connecting means according to the present invention.

The other elements are the same as the previous embodiment, and are identified by the same reference numerals in FIG. 3. Then, please refer to the previous treatise for a description of these elements.

Compared to the connecting means 5 of FIG. 3, the solution in FIG. 5 is more difficult to produce, but prevents large relative rotation of the hollow element 17 with respect to the base element 16 even during the assembling step, that is to say before using the joining element 12.

Referring particularly to FIGS. 6a 7b, a preferred embodiment of posts 2 and crossbeams 3 will be now described, even if different posts and/or crossbeams could be associated to the connecting means 5, 15.

In particular, in FIGS. 6a and 6b a preferred profile for the crossbeams 3 is shown. As shown, the crossbeams 3 are formed by a bent foil, and therefore have a substantially constant section along the whole length of the piece. In particular, the section of the crossbeams 3 has the shape of a hollow rectangle 3a wherein a vertex 3b of this rectangle 3a has a flange 3c. The flange 3c is shaped to have a first portion 3d shaped as the extension of one of the sides of the rectangle 3a, and a second portion 3e tilted with respect to the first portion 3d, preferably at an acute angle. The vertex 3f of the rectangle 3a, opposite to the vertex 3b, has in turn a flange 3g having a first portion 3h shaped as the extension of one of the sides of the rectangle 3a, and a second portion 3i perpendicular to the first portion 3h.

Therefore, the two flanges 3c and 3g are different from each other, but both have first portions 3d and 3h parallel to each others.

FIGS. 7a and 7b show in detail the section of the posts 2. In particular, the section of the posts 2 has the shape of a hollow square 2a wherein one vertex 2b of the square is beveled at 45°. In particular, it can be noted that this vertex is not formed by a right angle but by a short segment joining the sides of the square 2a that form the vertex 2b. In particular, a 45° angle is formed by the segment and these sides, so that to provide the vertex 2b with a "cut" shape. Two additional vertices 2c and 2d of the square 2a, opposite to one another and different from the vertex 2b, both have a flange 2c provided with a first portion 2f shaped as an extension of one of the sides of the square 2a, and a second portion 2g tilted with respect to the first portion 2f, in particular tilted at an acute angle with respect to the first portion 2f. The two flanges 2e are equal to each other and have been indicated with the same numeral.

Respective first portions 2f of the flanges 2e are perpendicular to each other. The flanges 3c, 3g and 2e make the structure more rigid without affecting the structure weight excessively, and also protect the respective central structures, that is to say the rectangle 3a and the square 2a, from external agents such as water and dust.

Figure 8A:
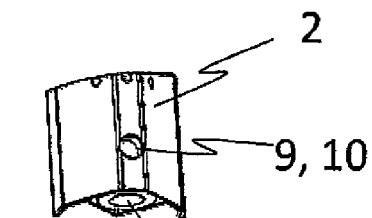
FIGS. 8a-8c are views in sequence of the assembling steps of the connecting means of FIG. 3.
Figure 8B:
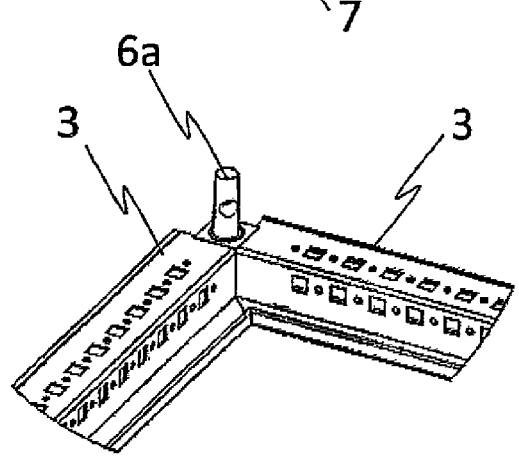
Figure 8C:
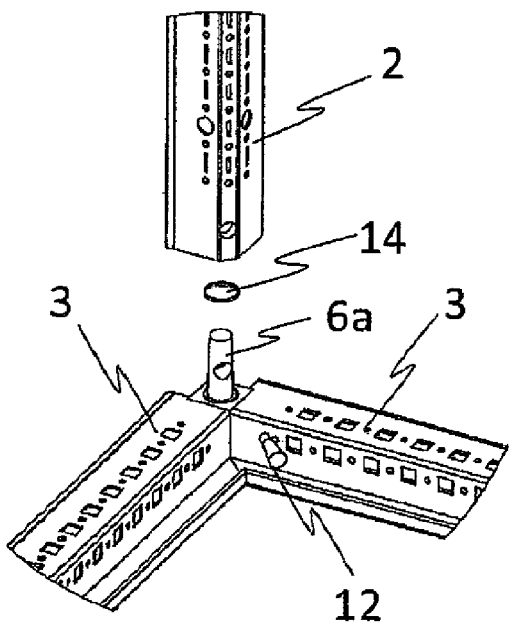
Figure 9:
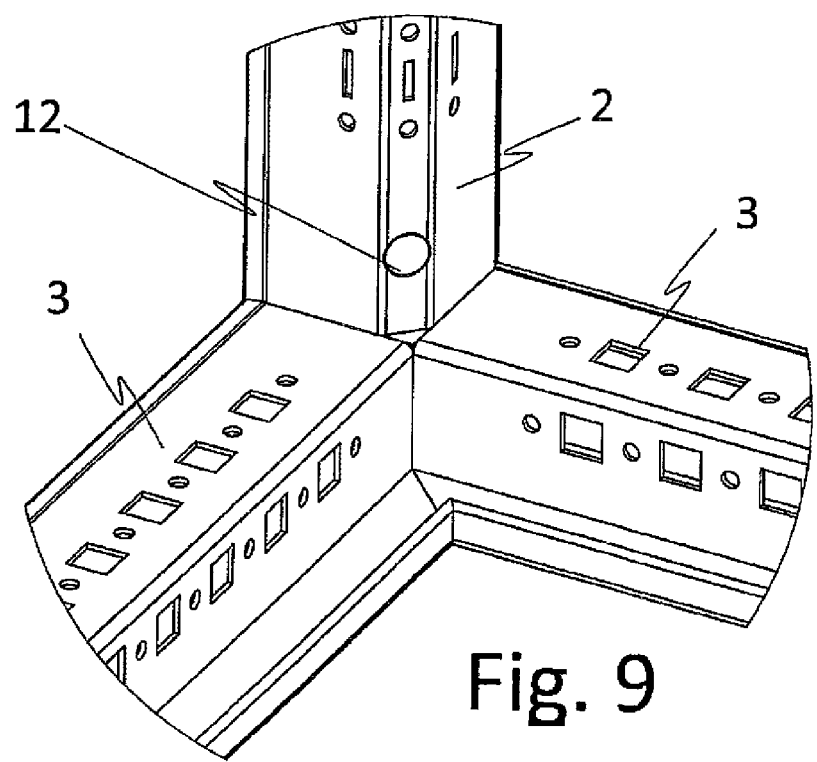
FIG. 9 is a perspective view of posts and crossbeams assembled by the connecting means of FIG. 3.

Referring now to FIGS. 8a-9, it will be illustrated the assembling process of the connecting means 5 with two crossbeams 2 and two posts 3. This assembling method is the same applied to the connecting means 15 and to the other possible embodiments of the present invention.

At first, the hollow element 7 is inserted into the post 2. In particular, when using the post 2 of FIGS. 6a-6b, the hollow element 7 is inserted into the square 2a by using. The bore 9 of the hollow element 7 and the bore 10 of the post 2 are arranged so that the respective axes fit, as in FIG. 8a.

As shown in FIG. 8b, the base element 6 is coupled to the crossbeams 2 instead. In particular, when using the crossbeams 3 of FIGS. 7a and 7b, the main body 6b is welded along the edges of the rectangle 3a by using. However, some considered jointing methods among base element 6 and crossbeams 3, provide for the partial insertion of the main body 6b into the rectangle 3a.

Subsequently, with reference to FIG. 8c, the seal 14 is arranged on the protrusion 6a and the protrusion 6a is inserted into the hollow element 7. In this condition, the bores 9, 10 and 11 are aligned, such as to allow the insertion of the joining element 12 inside them. As previously mentioned, a portion 9a of the bore 9 is threaded for cooperating with the threaded portion 12a of the joining element 12 and ensuring the tight coupling of various elements.

FIG. 9 shows the crossbeams 3 assembled to post 2 by means of the connecting means 5.

Figure 2:
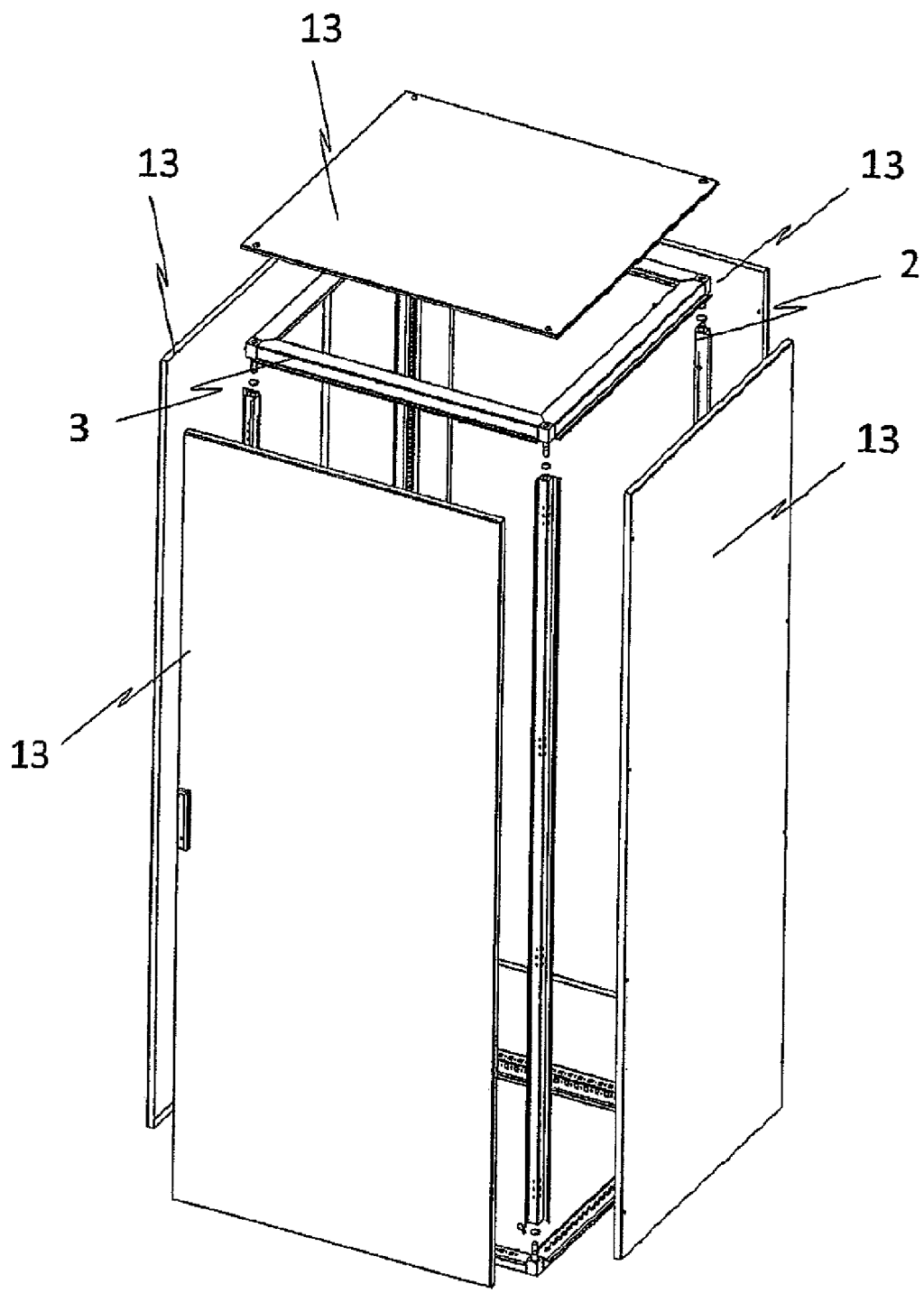
FIG. 2 is an exploded perspective view of a cabinet including the structure of FIG. 1.

After assembling all posts 2 and crossbeams 3 to each others, the structure of FIG. 1 is obtained, and then, as shown in FIG. 2, the panels 13 can be mounted to it to define the containing cabinet in its final condition.

The invention claimed is:

1. A structure for cabinet containing electrical materials comprising first elongated elements acting as posts, second elongated elements acting as crossbeams, and connecting means, said connecting means being adapted to join one to another at least two of said crossbeams and one of said posts, said connecting means including a base element and a hollow element which is provided with a substantial axial opening, said base element comprising an inserting portion adapted to couple inside said hollow element, said base element being further adapted to be constrained to said crossbeams, and said hollow element being adapted to be constrained to said post, said hollow element, said post and said inserting portion each including a bore, said bores being alignable to one another in operative conditions, and a joining element adapted to pass in each of said bores in a direction transverse to an axial direction of said inserting portion when said bores are aligned, to constrain said hollow element, said post and said inserting portion together, said joining element having a truncated—cone shaped portion, wherein said joining element further includes a threaded portion, said truncated—cone shaped portion of said joining element being longer than said threaded portion.

2. The structure for cabinet containing electrical materials according to claim 1, wherein said joining element further includes a threaded portion.

3. The structure for cabinet containing electrical materials according to claim 2, wherein said inserting portion has a truncated—cone shape, and said axial opening of said hollow element has a truncated—cone shaped profile, substantially corresponding to the shape of said truncated—cone shaped inserting portion.

4. The structure for cabinet containing electrical materials according to claim 2, wherein said inserting portion has a truncated—pyramid shape and a square base, and said axial opening of said hollow element has a truncated—pyramid shaped profile, substantially corresponding to the shape of said truncated—pyramid shaped inserting portion.

5. The structure for cabinet containing electrical materials according to claim 2, further comprising a main cabinet body welded to the crossbeams.

6. The structure for cabinet containing electrical materials according to claim 1, wherein said inserting portion has at least two sections of different size.

7. The structure for cabinet containing electrical materials according to claim 1, wherein said base element comprises a polyhedral main body, and a protrusion that forms said inserting portion.

8. The structure for cabinet containing electrical materials according to claim 1, wherein the bore of said hollow element is at least partially threaded.

9. The structure for cabinet containing electrical materials according to claim 1, wherein at least one section of said posts has the shape of a hollow square, wherein one vertex of said square is beveled at 45°, and two further vertices of said square, opposite one to another, both have a flange, having a first portion shaped as the extension of one of the sides of said square, and a second portion tilted with respect to said first portion.

10. The structure for cabinet containing electrical materials according to claim 1, wherein at least one section of said crossbeams has the shape of a hollow rectangle, wherein a first vertex of said hollow rectangle has a flange having a first portion shaped as the extension of one of the sides of said rectangle, and a second portion tilted with respect to said first portion, and wherein a second vertex of said rectangle, opposite to said first vertex, has a flange having a first portion shaped as the extension of one of the sides of said rectangle, and a second portion perpendicular to said first portion.

11. The structure for cabinet containing electrical materials according to claim 1, wherein at least one of said crossbeams and posts is a single bent foil.

12. The structure for cabinet containing electrical materials according to claim 1, wherein each of said bores is circular in shape and completely circumferentially surrounded by a surface.

13. The structure for cabinet containing electrical materials according to claim 1, wherein said base element comprises a single piece including a polyhedral main body and said inserting portion.

14. A connecting means for a structure for a cabinet containing electrical materials comprising first elongated elements acting as posts, second elongated elements acting as crossbeams, said connecting means being adapted to join one to another at least two of said crossbeams and one of said posts and comprising a base element and a hollow element which is provided with a substantial axial opening, said base element including an inserting portion adapted to couple inside said hollow element, said base element being further adapted to be constrained to said crossbeams, and said hollow element being adapted to be constrained to said post, wherein said hollow element, said post and said inserting portion are each provided with a bore, said bores being alignable to one another in operative conditions, and a joining element adapted to pass in each of said bores in a direction transverse to an axial direction of said inserting portion when said bores are aligned, to constrain said hollow element, said post and said inserting portion together, said joining element having a truncated—cone shaped portion, wherein said joining element further includes a threaded portion, said truncated—cone shaped portion of said joining element being longer than said threaded portion.

15. The connecting means for a structure for a cabinet containing electrical materials according to claim 14, wherein each of said bores is circular in shape and completely circumferentially surrounded by a surface.

* * * * *